US010629512B2

(12) United States Patent
Pan et al.

(10) Patent No.: US 10,629,512 B2
(45) Date of Patent: Apr. 21, 2020

(54) INTEGRATED CIRCUIT DIE WITH IN-CHIP HEAT SINK

(71) Applicant: Xilinx, Inc., San Jose, CA (US)

(72) Inventors: Hong-Tsz Pan, Cupertino, CA (US); Jonathan Chang, Mountain View, CA (US); Nui Chong, San Jose, CA (US); Henley Liu, San Jose, CA (US); Gamal Refai-Ahmed, Santa Clara, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/024,670

(22) Filed: Jun. 29, 2018

(65) Prior Publication Data

US 2020/0006186 A1    Jan. 2, 2020

(51) Int. Cl.
*H01L 23/48*    (2006.01)
*H01L 21/00*    (2006.01)
*H01L 23/367*   (2006.01)
*H01L 23/498*   (2006.01)
*H01L 23/528*   (2006.01)
*H01L 23/00*    (2006.01)
*H01L 25/065*   (2006.01)
*H01L 25/00*    (2006.01)

(52) U.S. Cl.
CPC ........ *H01L 23/3675* (2013.01); *H01L 23/481* (2013.01); *H01L 23/49827* (2013.01); *H01L 23/528* (2013.01); *H01L 24/06* (2013.01); *H01L 24/17* (2013.01); *H01L 25/0657* (2013.01); *H01L 25/50* (2013.01); *H01L 2224/06519* (2013.01); *H01L 2224/16146* (2013.01); *H01L 2224/16235* (2013.01); *H01L 2224/17519* (2013.01); *H01L 2225/06513* (2013.01); *H01L 2225/06586* (2013.01); *H01L 2225/06589* (2013.01)

(58) Field of Classification Search
CPC .............. H01L 23/3675; H01L 23/481; H01L 23/49827; H01L 23/528; H01L 24/06; H01L 24/17; H01L 24/97; H01L 25/0657; H01L 25/50
See application file for complete search history.

(56) References Cited

U.S. PATENT DOCUMENTS

| 6,433,360 B1 | 8/2002 | Dosdos et al. |
| 6,768,329 B1 | 7/2004 | Dosdos et al. |
| 6,849,940 B1 | 2/2005 | Chan et al. |
| 7,800,138 B2 * | 9/2010 | Baek ............... H01L 23/367 257/211 |

(Continued)

FOREIGN PATENT DOCUMENTS

FR        2901407 A1    11/2007

*Primary Examiner* — Alonzo Chambliss
(74) *Attorney, Agent, or Firm* — Patterson + Sheridan, LLP

(57) ABSTRACT

A method and apparatus are provided that includes an integrated circuit die having an in-chip heat sink, along with an electronic device and a chip package having the same, and methods for fabricating the same. In one example, an integrated circuit die has an in-chip heat sink that separates a high heat generating integrated circuit from another integrated circuit disposed within the die. The in-chip heat sink provides a highly conductive heat transfer path from interior portions of the die to at least one exposed die surface.

20 Claims, 7 Drawing Sheets

(56) References Cited

U.S. PATENT DOCUMENTS

| | | | |
|---|---|---|---|
| 8,310,046 B2* | 11/2012 | Baek | H01L 23/427 |
| | | | 257/215 |
| 9,082,633 B2 | 7/2015 | Grant | |
| 2004/0021198 A1 | 2/2004 | Wong | |
| 2004/0031004 A1* | 2/2004 | Yoshioka | G06F 17/5068 |
| | | | 257/347 |
| 2007/0290322 A1 | 12/2007 | Zhao et al. | |
| 2009/0302445 A1 | 12/2009 | Pagaila et al. | |
| 2010/0055843 A1* | 3/2010 | Liu | H01L 23/3677 |
| | | | 438/122 |
| 2017/0353211 A1 | 12/2017 | Roy et al. | |

* cited by examiner

INTEGRATED CIRCUIT DIE WITH IN-CHIP HEAT SINK

BACKGROUND

Field of the Disclosure

Examples of the present disclosure generally relate to an integrated circuit (IC) die having an in-chip heat sink, and packages and methods for fabricating the same.

Description of the Related Art

Electronic devices, such as tablets, computers, copiers, digital cameras, smart phones, control systems and automated teller machines, among others, often employ electronic components which leverage chip packaging for increased functionality and higher component density. Conventional chip packaging schemes often utilize a plurality of integrated circuit (IC) dies to be mounted to a single organic substrate. The dies may include memory, logic or other solid state circuitry.

In many instances, at least one solid state circuit disposed within a die generates a significant amount of heat. The generated heat may be problematic in that the heat is laterally transferred to neighboring solid state circuits within a chip package that cannot tolerate the additional amount of heat. This problem is exacerbated when the die containing the heat generating circuit is stacked below one or more other dies, thus spacing the die containing the heat generating circuit from external heat sinks and making it difficult to transfer heat out of the package. This heat transfer limitation reduces design flexibility, as thermal budgets may limit the amount of power consumption, along with the choice and location of the IC dies, and thus, undesirably limit performance of the chip package.

Therefore, a need exists for an IC die having improved heat transfer capabilities, along with packages and methods for fabricating the same.

SUMMARY

In one example, an integrated circuit die is provided that includes a die body, a first circuit, a second circuit and an in-chip heat sink. The die body includes an upper surface and a lower surface, the bottom surfacing having a plurality of bond pad for establishing electrical connection with circuitry within the die body. The first circuit is disposed in the die body and is electrically coupled to at least one of the bond pads. The first circuit is configured to operate at a first temperature. The second circuit is disposed in the die body and is electrically coupled to at least one of the bond pads. The second circuit is configured to operate at a second temperature that is less than the first temperature. The in-chip heat sink has a ring-shape and an orientation extending between the upper surface and the lower surface of the die body. The in-chip heat sink separates the first circuit from the second circuit.

In another example, an integrated circuit chip package is provided that includes a package substrate, a first integrated circuit (IC) die and a second IC die. The first IC die is coupled to the top side of the package substrate by first solder connections. The first IC die includes a die body, a first circuit, a second circuit and an in-chip heat sink. The die body includes an upper surface and a lower surface, the bottom surfacing having a plurality of bond pad for establishing electrical connection with circuitry within the die body. The first circuit is disposed in the die body and is electrically coupled to at least one of the bond pads. The first circuit is configured to operate at a first temperature. The second circuit is disposed in the die body and is electrically coupled to at least one of the bond pads. The second circuit is configured to operate at a second temperature that is less than the first temperature. The in-chip heat sink has a ring-shape and an orientation extending between the upper surface and the lower surface of the die body. The in-chip heat sink separates the first circuit from the second circuit.

In yet another embodiment, an integrated circuit package is provided that includes a package substrate, a first integrated circuit die, and a second integrated circuit die. The package substrate has a top side and a bottom side. The first integrated circuit die has a first in-chip heat sink. The second integrated circuit die is disposed on the top side of the package substrate and has a second in-chip heat sink that is coupled to the first in-chip heat sink through one or more solder connections.

In still another embodiment, as method for forming an integrated circuit die is provided. The method includes forming a first circuit in a die body of an IC die, forming a second circuit is formed in the die body of the IC die, and forming an in-chip heat sink in the die body of the IC die between the first circuit and the second circuit.

In still another embodiment, as method for forming an integrated circuit die is provided. The method includes mounting an first IC die on an second IC die, the second IC die having an in-chip heat sink, mounting the stacked die on a package substrate, coupling one or more of a stiffener, a cover and an external heat sink to the package substrate having the dies stacked thereon to form a chip package, mounting the chip package to a printed circuit board, and mounting an optional heat sink to the bottom surface of the printed circuit board.

BRIEF DESCRIPTION OF THE DRAWINGS

So that the manner in which the above recited features of the present disclosure can be understood in detail, a more particular description of the implementation, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, where possible, to designate identical elements that are common to the figures. It is contemplated that elements of one example may be beneficially incorporated in other examples.

DETAILED DESCRIPTION

Examples of the disclosure generally provide an integrated circuit (IC) die having an in-chip heat sink, and packages and methods for fabricating the same. The in-chip heat sink separates a high heat generating integrated circuit device from another integrated circuit device disposed within the same die, thus substantially reducing the amount of heat transfer laterally between the devices disposed within the die. In this manner, the high heat generating integrated circuit device does not thermally contaminate the neighboring integrated circuit device, thus allowing the neighboring integrated circuit device to run more efficiently. Moreover, the thermal isolation provided by the in-chip heat sink allows neighboring devices to consume more power with reduced risk of overheating, thus providing improved performance and more design flexibility. Furthermore, as the in-chip heat sink enhances heat transfer out of the die, better die performance may be achieved at lower operating temperatures.

In some examples, integrated circuit packages are provided with stacked IC dies, at least one of which having an in-chip heat sink. The in-chip heat sink facilitates efficient transfer of heat out of the package, thus allowing for greater flexibility of die choices within a package. Moreover, the in-chip heat sink is particularly useful for removing heat from dies that are spatially separated from heat sinks by allowing heat to be routed out one die and through the in-chip heat sink of the adjacent die, thus enabling high powered dies to be utilized practically anywhere within the package. Accordingly, increase package design flexibility is enabled while desirably increasing performance without external and costly out of die heat sinking devices.

Beneficially, the in-chip heat sink may be incorporated within an IC die using conventional semiconductor fabrication techniques. In some examples, the in-chip heat sink may be fabricated utilizing the metal layers already utilized within the die, thus having little to no impact on fabrication costs.

Thus, the in-chip heat sink advantageously improves the thermal management of heat generated within a die. As a result, better device performance is enabled over a wider range of operating conditions, with less expense and reduced manufacturing complexity.

Figure 1:
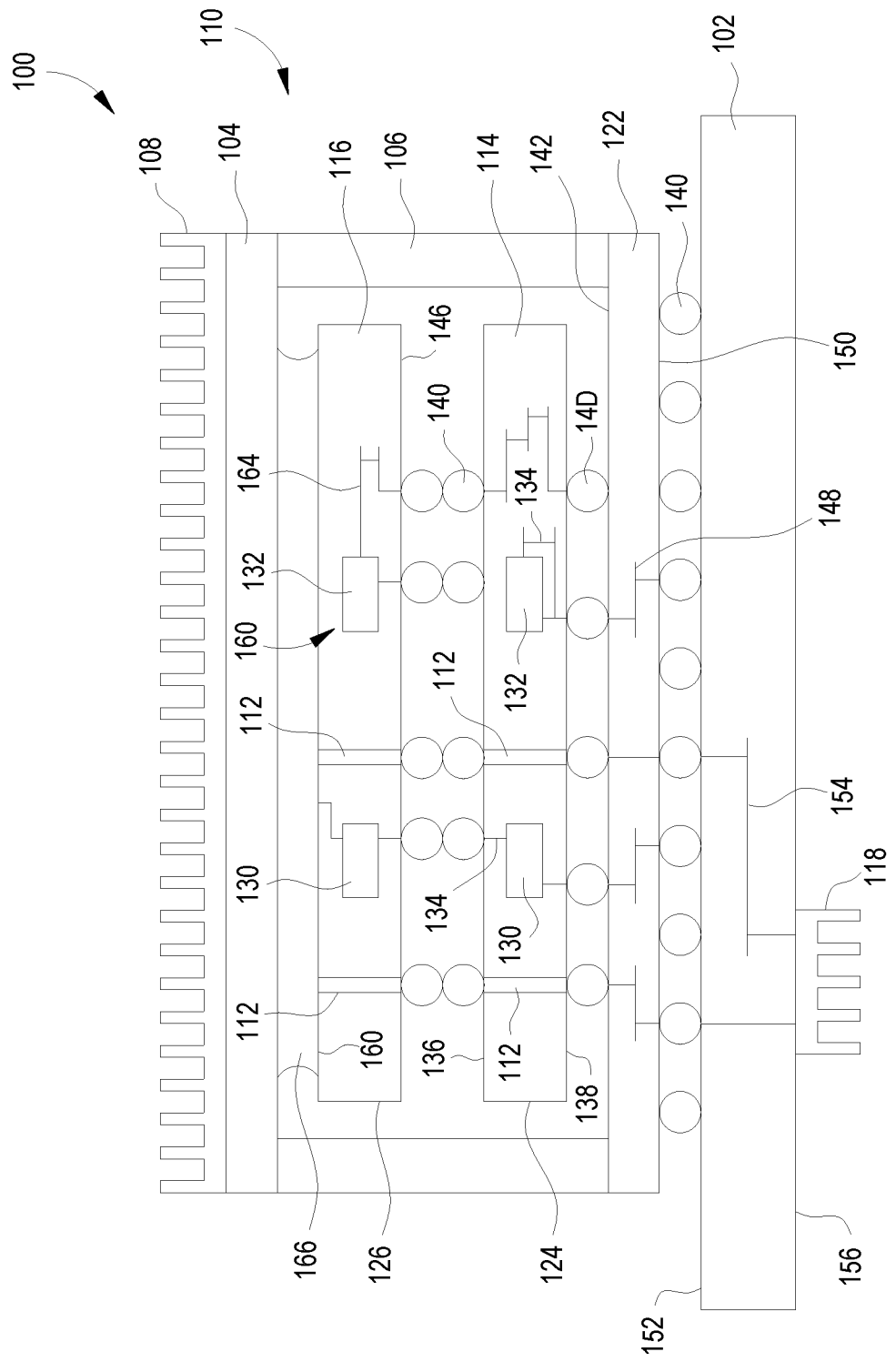
FIG. 1 is a front schematic view of an exemplary electronic device having an integrated chip package, the chip package including a plurality of IC dies, at least one of which having an in-chip heat sink.

Turning now to FIG. 1, an exemplary electronic device 100 is schematically illustrated. The electronic device 100 includes an integrated chip package 110 disposed on a printed circuit board (PCB) 102. The electronic device 100 may be part of a computer, tablet, cell phone, smart phone, consumer appliance, control system, automated teller machine, programmable logic controller, printer, copier, digital camera, television, monitor, stereo, radio, radar, or other solid state device utilizing and having a chip package 110 disposed therein.

The chip package 110 includes at least one integrated circuit (IC) die 114 disposed on a package substrate 122. One or more additional IC dies 116 may also be stacked on and coupled to the IC die 114. Although only one additional IC die 116 is shown stacked on the IC die 114 in FIG. 1, any reasonable number of additional IC dies 116 may be stacked on the IC die 114 within the confines of the chip package 110. Although the package substrate 122 is illustrated as a single element, the package substrate 122 may include an interposer for mounting the die 114, 116.

At least one of the IC dies 114, 116 includes one or more in-chip heat sinks 112 as further discussed below. The in-chip heat sink 112 provides an efficient thermally conductive from the interior to at least one exterior surface of the die.

The chip package 110 may also include a cover 104, a stiffener 106 and an external heat sink 108. The stiffener 106 is mounted on the package substrate 122 to maintain flatness of the package substrate 122. The cover 104 is disposed over the top-most die within the package substrate 122, and proves a greater surface area for dissipating heat from the dies 114, 116 while assisting to maintain dimensional stability of the package 110. The heat sink 108 is mounted on the cover 104 on the side of the cover 104 disposed opposite the dies 114, 116.

The die 114 includes a die body 124 in which at least two integrated circuits (solid state circuits) 130, 132 are formed. The first solid state circuit 130 has circuitry that generates more heat during operation than circuitry of the second solid state circuit 132. For example, the first circuit 130 may consume more power than the second circuit 132. In one example, the first circuit 130 is a processor circuit while the second circuit 132 is a memory circuit. To prevent lateral heat transfer from the hot first circuit 130 to the cooler second circuit 132, the in-chip heat sink 112 is disposed therebetween. The in-chip heat sinks 112 is generally a thermally conductive wall that extends between an upper surface 136 and a lower surface 138 of the die body 124. In one example, the in-chip heat sink 112 forms part of a highly conductive heat transfer path that is exposed through the upper surface 136 of the die body 124. In another example, the in-chip heat sink 112 forms part of a highly conductive heat transfer path that is exposed through the lower surface 138 of the die body 124. In other embodiments, the in-chip heat sink 112 extends from the lower surface 138 to the upper surface of the die body 124, thus providing an efficient bi-directional heat transfer path form the interior regions of the die 114 to exterior surfaces 136, 138 of the die 114. The heat transfer path is highly conductive relative to the heat moving through the dielectric materials comprising the non-metal portions of the die 114.

It should be noted that since the in-chip heat sink 112 provides a highly conductive heat transfer path to one or more exposed surfaces of the die body 124, the in-chip heat sink 112 may also be beneficially utilized with circuits having the same or similar power consumption so that the maximum operating temperature of the IC die is not exceeded.

The circuits 130, 132 of the die 114 are coupled by interconnect circuitry 134, such as vias and lines, formed within the metal layers comprising the die 114 to contact pads exposed on the upper surface 136 and the lower surface 138 of the die body 124. The interconnect circuitry 134 may optionally pass laterally through the in-chip heat sink 112. A solder connection 140 electrically and mechanically connects the pads exposed on the lower surface 138 of the die 114, and thus the interconnect circuitry 134, to contact pads formed on an upper surface 142 of the package substrate 122. Similarly, a solder connection 140 electrically and mechanically connects the pads exposed on the upper surface 136 of the die 114, and thus the interconnect circuitry 134, to contact pads formed on a lower surface 146 of an adjacent die 116 that is stacked on top of the die 114.

The contact pads formed on the upper surface 142 of the package substrate 122 are connected to conductors 148 of the package substrate 122. The conductors 148 of the package substrate 122 may reside on the upper surface 142 of the package substrate 122, within the package substrate 122, and/or through the package substrate 122. The conductors 148 of the package substrate 122 may be lines, printed traces, vias and the like. In the example depicted in FIG. 1, the conductors 148 extend through the package substrate 122 and are coupled to contact pads formed on a lower surface 150 of the package substrate 122. The contact pads formed on the lower surface 150 of the package substrate 122 are electrically and mechanically connected to contact pads formed on an upper surface 152 of the PCB 102.

The contact pads formed on the upper surface 152 of the PCB 102 are connected to conductors 154 of the PCB 102. The conductors 154 of the PCB 102 may reside on the upper surface 152 of the PCB 102, within the PCB 102, and/or through the PCB 102. The conductors 154 of the package substrate 122 may be lines, printed traces, vias and the like. In the example depicted in FIG. 1, the conductors 154 extend through the PCB 102 and are coupled to contact pads formed on a lower surface 156 of the PCB 102. The contact pads formed on the lower surface 156 of the PCB 102 are electrically and mechanically connected to an optional heat sink 118 disposed on the lower surface 156 of the PCB 102.

The die 116 is stacked on and in contact with the die 114. The die 116 includes a die body 126 having a lower surface 146 and an upper surface 160. Contact pads exposed on the lower surface 146 of the die 116 is electrically and mechanically coupled to the contact pads exposed on the upper surface 136 of the die 114.

The die body 126 includes one or more solid state circuits 162 formed therein, such as memory, logic, or other solid state circuit device. In the example depicted in FIG. 1, the circuits 162 are illustrated as the circuits 130, 132. However, any one or more or even all of circuits 162 formed within the die body 126 may be of the same power, lower power, or higher power than one of the circuits 130, 132 formed in the die 114. The circuits 130, 132 of the die 116 are coupled by interconnect circuitry 164, such as vias and lines, formed within the metal layers comprising the die body 126 to contact pads exposed on the lower surface 146 and optionally the upper surface 160 of the die 116.

Thermal interface material (TIM) 166, such as thermally conductive grease and the like, is disposed between the upper surface 160 of the die 116 and the cover 104. The TIM 166 provides good the transfer between the die 116 and the cover 104, thus allowing the dies 114, 116 within the chip package 110 transfer excess heat efficiently away from the circuits 130, 132, and maintain the circuits 130, 132 within a safe operating temperature range. The external heat sink 108 may optionally be mounted to the cover 104 to further transfer heat out of the package 110.

It is contemplated that some implementations of the chip package 110 may not include the cover 104 and/or the heat sink 108. However, in example of a package 110 utilizing the cover 104, the stiffener 106 may optionally be coupled to the cover 104.

The die 116 additionally includes one or more in-chip heat sinks 112 disposed within the die body 126. The in-chip heat sinks 112 generally extends between the upper surface 160 and a lower surface 146 of the die 116, thus providing an efficient heat transfer path form the interior regions of the die body 126 to exterior surfaces 160, 146 of the die 116. The in-chip heat sinks 112 disposed through the die 116 provides an efficient heat transfer path to conduct heat from the die 114, through the die 116, to the cover 104. In one example, the in-chip heat sinks 112 of the die 114 is connected to the in-chip heat sinks 112 of the die 116 by a metal or otherwise thermally conductive path, such as by metal interconnect circuitry and solder connections between the dies 114, 116. In a simplest form, the in-chip heat sink 112 of the die 116 may be configured as a metal filled via. Further details of the in-chip heat sink 112 utilized in the dies 114, 116 are provided below.

Figure 2:
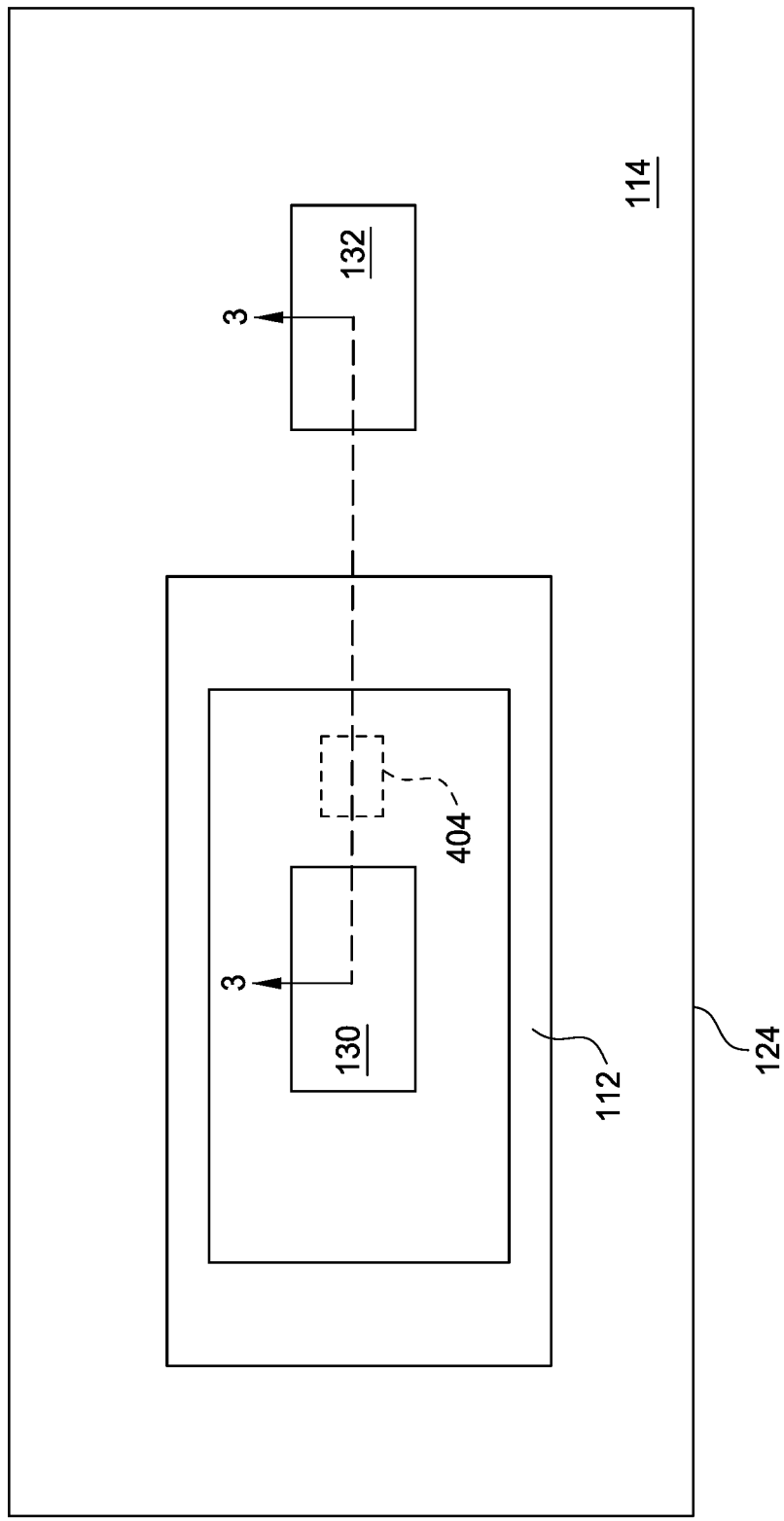
FIG. 2 is a sectional view of one of the IC dies depicted in FIG. 1 through the in-chip heat sink.

FIG. 2 is a sectional view of the IC die 114 depicted in FIG. 1 taken through the in-chip heat sink 112. The in-chip heat sink 112 utilized in the die 116 may be constructed similarly. As described above, the in-chip heat sink 112 separates the hotter first circuit 130 to the cooler second circuit 132, thus providing a thermal barrier that significantly reduces the thermal contamination of the second circuit 132 by heat generated by the first circuit 130. Although the in-chip heat sink 112 is shown only separating a single higher powered first circuit 130 from a single low powered second circuit 132, the in-chip heat sink 112 may separate one or more high powered circuits 130 one or more low powered second circuit 132. It is also contemplated that more than one in-chip heat sink 112 may be utilized in a single die.

The in-chip heat sink 112 may simply be a wall between the IC circuits 130, 132, or may partially or completely surround the higher powered first circuit 130. In the example depicted in FIG. 2, the in-chip heat sink 112 has a ring shape that completely surrounds the higher powered first circuit 130. In other examples, the in-chip heat sink 112 may discontinuously surround the higher powered first circuit 130, for example, but leaving space of the interconnect circuitry 134 to be routed through the in-chip heat sink 112 without shorting. In yet other embodiments, the in-chip heat sink 112 may be coupled to power or ground circuitry with the die 114. In other examples, the in-chip heat sink 112 is floating relative to the power and ground, and isolated from the signal transmission paths connected to the first circuit 130 by the interconnect circuitry 134.

The in-chip heat sink 112 is generally formed by the metal layers comprising the die 114. Thus, the in-chip heat sink 112 may be fabricated from one or more of aluminum, copper, tungsten, titanium, tantalum or other suitable metal or similarly thermally conductive material. The metal layers comprising the in-chip heat sink 112 are separated within the die 114 by dielectric layers.

In the example depicted in FIG. 2, as single in-chip heat sink 112 is employed to laterally separate and thermally isolate the IC circuits 130, 132. However, multiple in-chip heat sinks 112 may be utilized within a single die body 124 to separate one or more hot circuits 130 from cooler circuits 132. Conversely, multiple in-chip heat sinks 112 may be utilized within a single die body 124 to separate one or more cooler circuits 132 from one or more hotter circuits 130.

Figure 3:
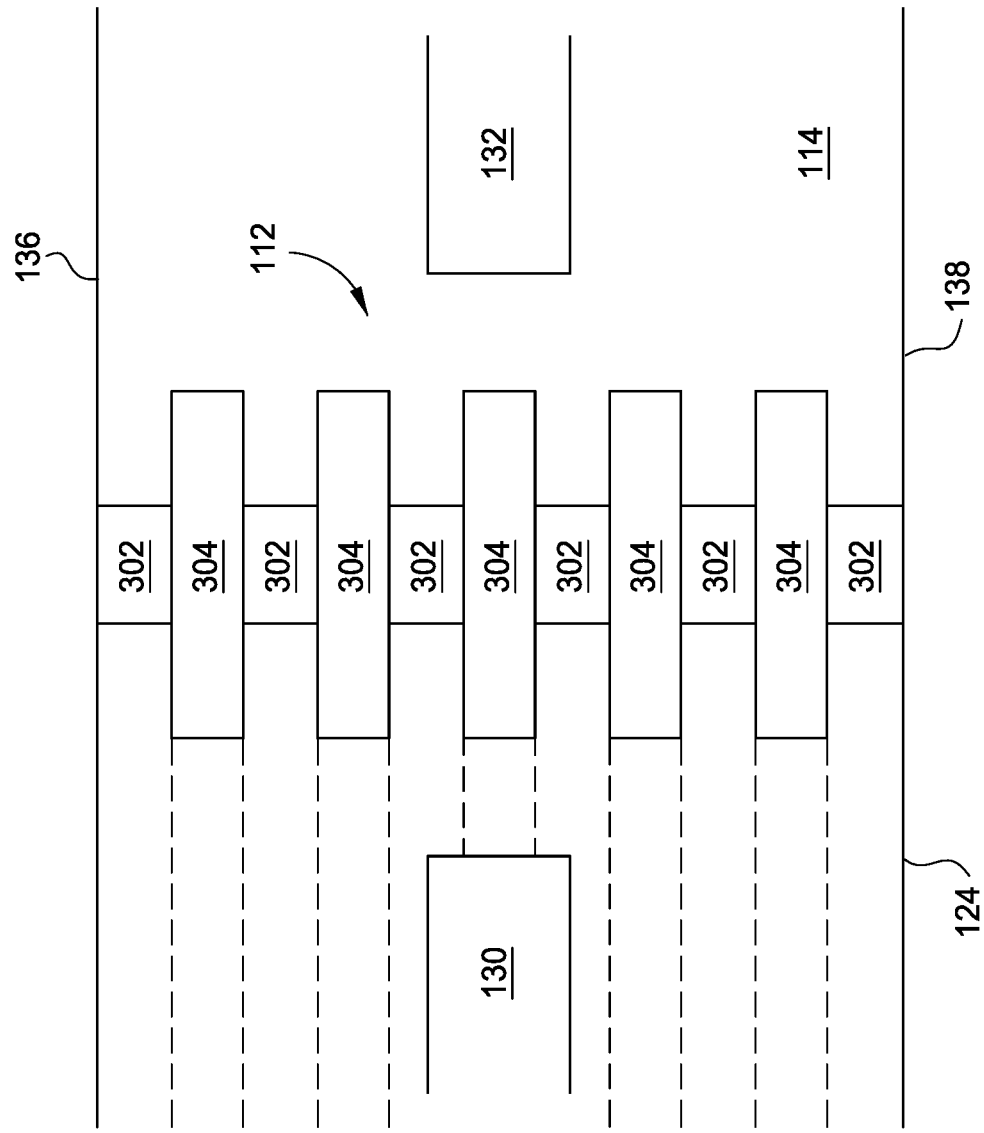
FIG. 3 is a partial schematic sectional view of the IC die taken along section line 3-3 depicted in FIG. 2 illustrating a portion of the in-chip heat sink.

FIG. 3 is a partial schematic sectional view of the IC die 114 taken along section line 3-3 depicted in FIG. 2 illustrating a portion of the in-chip heat sink 112. The in-chip heat sink 112 is illustrated in FIG. 3 extending between the upper surface 136 and the lower surface 138 of the die body 124, with ends of the heat sink 112 being exposed to the exterior surfaces 136, 138 of the die 114.

The in-chip heat sink 112 is generally comprised of vias 302 coupling stacked lines 304 forming a thermally conductive wall within the die body 124. The upper-most via 302 may couple the lines 304 to a contact pad (not shown)

exposed on the upper surface 136 of the die 114. Similarly, the lower-most via 302 may couple the lines 304 to a contact pad (not shown) exposed on the lower surface 138 of the die 114. The vias 302 and lines 304 comprising the in-chip heat sink 112 are fabricated from the metal layers separated by the dielectric layers within the die body 124, making the in-chip heat sink 112 thermally conductive relative to the dielectric material comprising the die body 124.

In the example depicted in FIG. 3, the in-chip heat sink 112 (i.e., line 304 or via 302) comprises at least one metal layer that also comprise the first circuit 130. Although the in-chip heat sink 112 is shown extending between the exterior surfaces 136, 138 of the die body 124 to provide a bi-directional heat transfer path, the heat sink 112 may alternatively extend from a metal layer shared with the first circuit 130 and only one of the exterior surfaces 136, 138 of the die 114 to provide a single direction heat transfer path (i.e., only to one of the surfaces 136, 138).

In operation, a significant amount of heat generated by the first circuit 130 is effectively prevented from reaching the second circuit 132 because the heat is preferentially conducted through the in-chip heat sink 112 to one or both of the exterior surfaces 136, 138 of the die 114. Thus, the in-chip heat sink 112 enables better thermal control of both IC circuits 130, 132, resulting in the ability to utilize more powerful circuits within the die 114 without overheating or diminishing performance.

As the in-chip heat sink 112 effectively improves the performance of a single die 114, the advantageous of the in-chip heat sink 112 may be realized in a single die 114 even without further packaging, such as the chip package 110 described herein. However, the in-chip heat sink 112 is particularly useful in chip packages 110 having stacked die.

Although the plan view of in-chip heat sink 112 appears as a rectangle in FIG. 3, having four straight (e.g., linear) sides, the in-chip heat sink 112 may other other configurations, including other polygonal shapes, irregular shapes or other desired shape. Additionally, the portion of the in-chip heat sink 112 comprising a "side" of the rectangle or other plan form may have a non-linear configuration.

Figure 4:
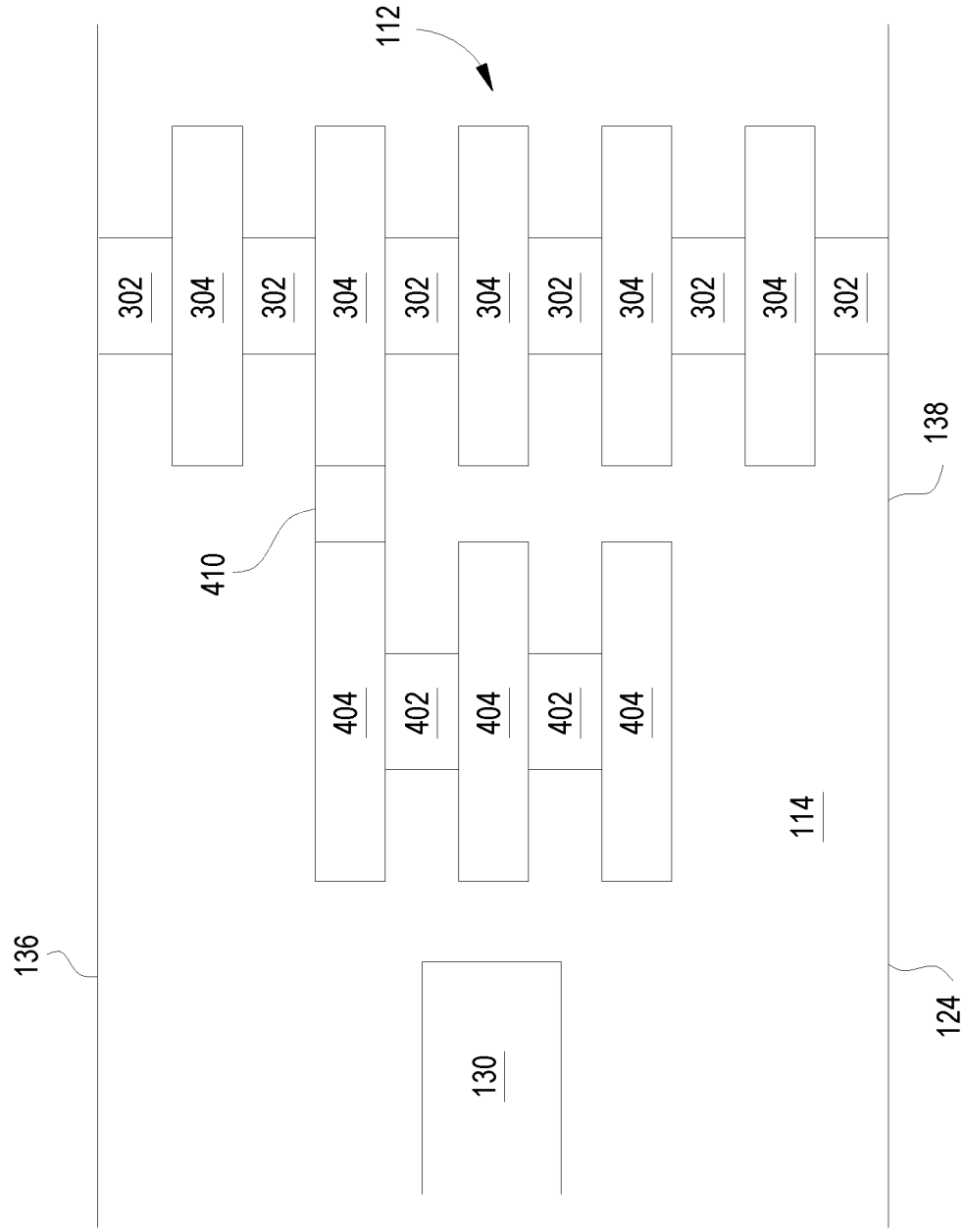
FIG. 4 is another partial schematic sectional view of an IC die illustrating a portion of the in-chip heat sink disposed adjacent dummy islands.

FIG. 4 is another partial schematic sectional view of an IC die 400 illustrating a portion of an in-chip heat sink 112 disposed adjacent dummy islands 404. The IC die 400 may be configured essentially identical to the IC die 114 described above except for the addition of the dummy islands 404, and may be utilized in place of either or both of the IC dies 114, 116 of the chip package 110.

The dummy islands 404 are not coupled to the circuitry of the circuits 130, 132 and are distributed within the die body 124 to provide a balance of metal needed to obtain good planarization and good tolerance control between layers. In conventional IC dies, the dummy islands are not interconnected. Here, to improve vertical heat transfer within the die body 124, the dummy islands 404 are connected by one or more vias 402. The vias 402 provide a thermal path having a high heat transfer rate which is utilized to transfer heat away from the hot first circuit 130 and towards at least one of the exterior surfaces 136, 138 of the die 114. Although the dummy islands 404 interconnected by vias 402 are illustrated in FIG. 4 on the hotter circuit side of the in-chip heat sink 112, dummy islands 404 interconnected by vias 402 may also be present, as an alternative or in addition to, on the cooler circuit side of the in-chip heat sink 112.

The heat sinking characteristics of the dummy islands 404 interconnected by vias 402 may be enhanced by coupling one or more of the dummy islands 404 to the in-chip heat sink 112 by a bridge 410 (shown in phantom). In this configuration, the heat sinked by the dummy islands 404 is effectively transferred away from the first circuit 130 to the in-chip heat sink 112, where the heat is effectively conducted to the exterior surfaces 136, 138 of the die 114. Beneficially, the dummy islands 404 also significantly improve heat removal by efficiently conducting heat laterally from the circuit 130 to the in-chip heat sink 112 faster than what would occur through the dielectric material of the die body 124.

Alternatively, the dummy islands 404 may not be interconnected by vias 402, but rather one or more of the dummy islands 404 may be directly connected to the in-chip heat sink 112.

Figure 5:
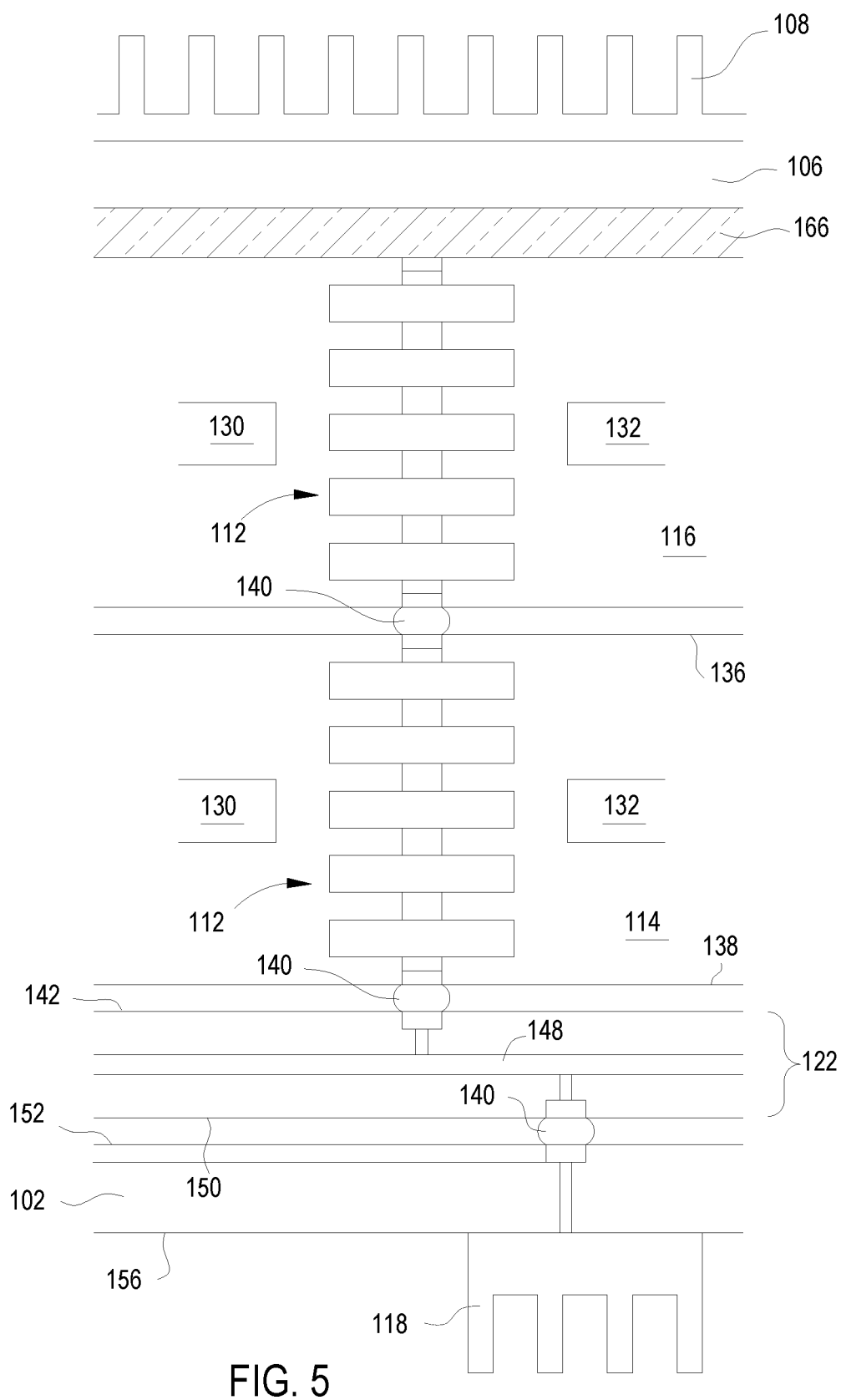
FIG. 5 is a schematic partial sectional view of the electronic device of FIG. 1 illustrating a conductive connection between in-chip heat sinks disposed in IC dies stacked within the integrated chip package of the electronic device.

FIG. 5 is a schematic partial sectional view of the electronic device 100 of FIG. 1 illustrating the solder connection 140 between in-chip heat sinks 112 disposed in IC dies 114, 116 stacked within the integrated chip package 110 of the electronic device 100. As illustrated in FIG. 5, the in-chip heat sink 112 formed in the die body 124 terminates at a contact pad 502 and a contact pad 504 exposed on the exterior surfaces 136, 138 of the die 114. Similarly, the in-chip heat sink 112 formed in the die body 126 terminates at a contact pad 512 and a contact pad 514 exposed on the exterior surfaces 146, 160 of the die 116. The dies 114, 116 are stacked in an orientation that aligns the contact pad 504 with the contact pad 512. The in-chip heat sinks 112 disposed in IC dies 114, 116 do not necessarily vertically align with the pads 504, 512 with an appropriate routing of the interconnect circuitry. Stated differently, the in-chip heat sinks 112 disposed in IC dies 114, 116 may be laterally offset while remaining thermally connected through the solder connections 140 and routing interconnects within the dies 114, 116.

The contact pads 504, 512 are electrically and mechanically coupled utilizing the solder connection 140. In one example, the solder connection 140 is comprises of solder. The solder connection 140 facilitate rapid and direct transfer of heat between the contact pads 504, 512, and consequently, the in-chip heat sinks 112 of the IC dies 114, 116. Thus, heat generated by the first circuit 130 may be preferentially routed out of the die 114 through the heat sink 112 into the adjacent stacked die 116 without laterally transferring significant heat to the second circuit 132 within the die 114.

In embodiments wherein one or more additional dies 116 are stacked on the die 116, solder connections 140 may be utilized between each of the adjacent dies 116, 116 such that heat is readily transferred through neighboring dies 116, 116 and away from the die 114 containing the heat generating first circuit 130.

As discussed above, having a single die 114 comprising the in-chip heat sink 112 provides a significant advantage of temperature control within a single die 114 even if further heat mitigation techniques are not utilized. However, one or more additional heat transfer enhancements as described without limitation below may be utilized in concert with the in-chip heat sink 112 to further improve temperature control within a package 110 having stacked die 114, 116.

One such temperature control enhancement is routing heat out through the lower surface 138 of the die 114. In such an example, the contact pad 502 may be coupled via a solder connection 140 to the package substrate 122. The solder connection 140 between the package substrate 122 and the die 114 provides a thermal mass to sink heat drawn out of the die 114 through the in-chip heat sink 112.

The package substrate 122 may include one or more metal layers, routings or patterns suitable to function as a heat sink. In such embodiments, the solder connection 140 to the package substrate 122 may contact a pad or other thermal conductor that is coupled to the conductors 148 of the package substrate 122. The conductors 148 may have enough mass to function as a heat sink or may otherwise be utilized to route heat way in-chip heat sink 112 and into the package substrate 122.

In other example, the conductors 148 may be routed though or over the package substrate 122 to the optional stiffener 106. The stiffener 106 may be fabricated from metal or other material having sufficient thermal mass to serve as a heat sink for the heat being transferred out of the die body 124 through the in-chip heat sink 112, into the package substrate 122 and subsequently to the stiffener 106.

In other examples, the conductors 148 may be routed though the package substrate 122 to the optional heat sink 118 disposed below the PCB 102 or to another heat transfer device, such as a heat pipe, cooler or canister of phase change material, among others.

Another temperature control enhancement is routing heat out through the upper surface 136 of the die 114. In such an example, the contact pad 504 may be in contact with the contact pad 512 of the adjacent die 116, which draws heat out of the die 114 and into the in-chip heat sink 112 of the die 116.

Another temperature control enhancement is routing heat out of the in-chip heat sink 112 of the die 116 through the upper surface 160 of the die 116. In such an example, the upper surface 160 of the die 116 may be in contact with the TIM 166 which draws heat out of the die body 126. Additionally, the in-chip heat sink 112 of the die 116 may optionally be in contact with the TIM 166 to improve the efficiency of heat transfer out of the die 116. The TIM 166 is in contact with the cover 104 which serves as a heat sink. Optionally, another heat transfer device, such as an external heat sink 108, a heat pipe, cooler or canister of phase change material, among others, may be mounted on the cover 104 to further increase the efficiency of heat transfer from the the in-chip heat sink 112 of the die 116, and ultimately from the in-chip heat sink 112 and first circuit 130 of the die 114.

Although not shown in FIG. 5, dummy islands 404 may be utilized with any of the examples described above. The dummy islands 404 may be interconnected by vias 402. Alternatively or in addition to the dummy islands 404 being interconnected by vias 402, one or more dummy islands 404 may be connected by a bridge 410 to the in-chip heat sink 112. In the example described above, at least a portion of the dummy islands 404 reside on the same side of the in-chip heat sink 112 as the first circuit 130.

Figure 6:
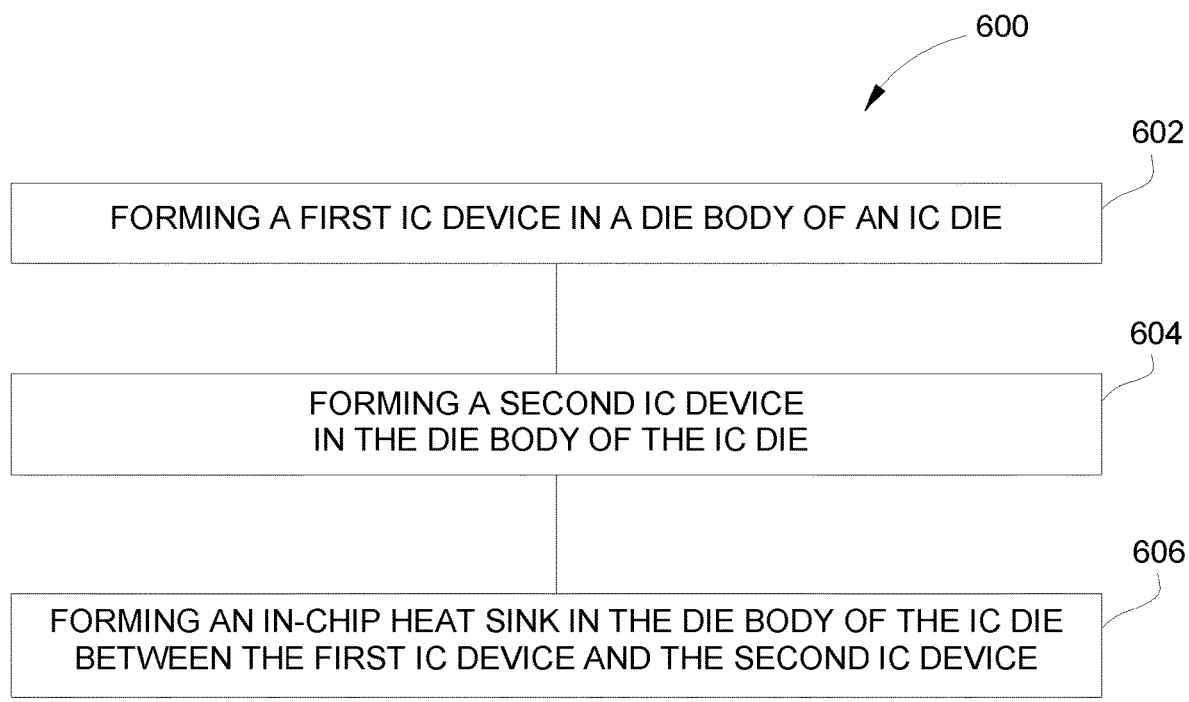
FIG. 6 is flow diagram of a method for fabricating an integrated circuit die having an in-chip heat sink.

FIG. 6 is flow diagram of a method 600 for fabricating a die having an in-chip heat sink, such as the IC die 114 and the in-chip heat sink 112 described above. The method 600 begins at operation 602 by forming a first circuit 130 in a die body 124 of the IC die 114. The first circuit 130 may be formed by sequentially depositing and patterning metal and conductive layers utilizing semiconductor fabrication techniques. The first circuit 130 may be configured as a processor or other similar circuitry.

At operation 604, a second circuit 132 is formed in the die body 124 of the IC die 114. The first circuit 130 may generate more heat in operation than the second circuit 132. For example, the second circuit 132 may be configured as a memory or other circuit having drawing less power during operation relative to the first circuit 130. The second circuit 132 is formed by sequentially depositing and patterning metal and conductive layers utilizing semiconductor fabrication techniques.

At operation 606, an in-chip heat sink 112 is formed in the die body 124 of the IC die 114 between the first circuit 130 and the second circuit 132. The in-chip heat sink 112 is formed is formed between the upper and lower surfaces 136, 138. The in-chip heat sink 112 is formed by connecting lines 304 formed from metal layers of the die body 124 utilizing vias 302. The lines 304 and vias 302 are stacked within the die body 124, forming a conductive wall between the circuits 130, 132. The in-chip heat sink 112 may be formed in a pattern that circumscribes one of the IC circuits 130, 132, for example the hotter first circuit 130. The conductive lines 304 and vias 302 may be formed utilizing convention metalization techniques or other suitable technique. The conductive lines 304 and vias 302 may be stacked such that the ends of the in-chip heat sink 112 are exposed on the exterior surfaces 136, 138 of the die body 124.

Figure 7:
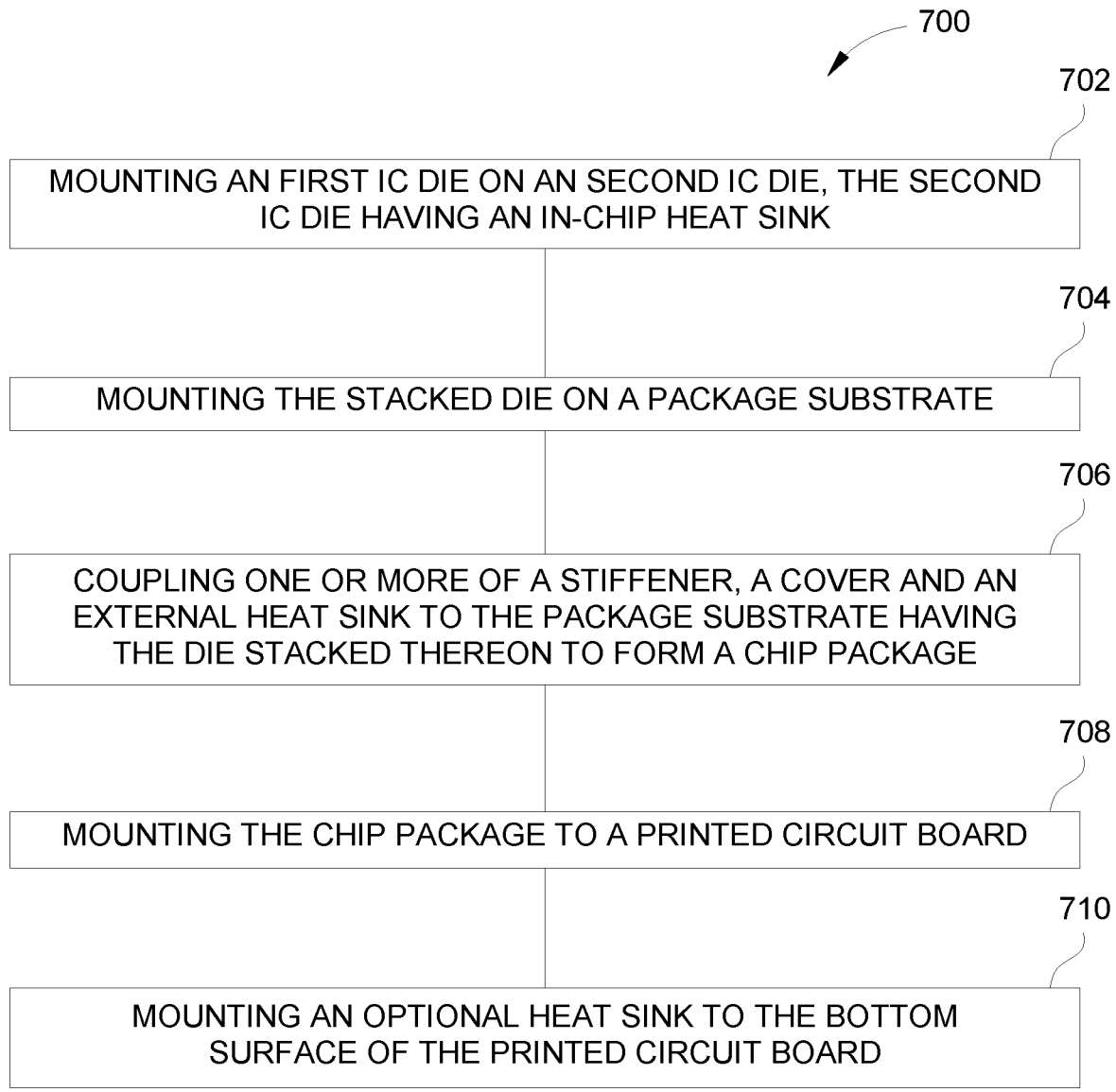
FIG. 7 is flow diagram of a method for fabricating an integrated circuit chip package having stacked dies with interconnected in-chip heat sinks.

FIG. 7 is flow diagram of a method 700 for fabricating an integrated chip package having stacked dies with interconnected in-chip heat sinks. The method 700 begins at operation 702 by mounting an IC die 116 on an IC die 114, the IC die 114 having an in-chip heat sink 112. The IC die 116 may be mounted on the IC die 114 using a plurality of solder connections 140. As discussed above, the in-chip heat sink 112 extends between the upper surface 136 and the lower surface 138 of the die body 124 of the IC die 114.

In one example, when the IC die 116 is mounted on the IC die 114, the in-chip heat sink 112 of the IC 114 is connected via one or more solder connections 140 to an in-chip heat sink 112 of the IC 116. In this manner, heat is effectively transferred out of the IC 114 through the upper surface 136 and away from the second circuit 132 residing in the IC 114 that may be adversely affected by the heat generated by the neighboring first circuit 130 disposed within the die body 124.

At operation 704, the stacked die 114, 116 are mounted to a package substrate 122. The lower surface 138 of the IC die 114 may be mounted on the package substrate 122 using a plurality of solder connections 140.

In one example, the in-chip heat sink 112 of the IC die 114 is coupled through one or more solder connections 140 to conductors 148 disposed in or on the package substrate 122. The solder connections 140 couple conductors 148 of the package substrate 122 to in-chip heat sink 112 of the IC die 114, such providing an efficient heat transfer path for heat generated by the first circuit 130 out through the lower surface 138 of the die body 124 and into the package substrate 122.

At operation 706, one or more of a stiffener 106, a cover 104 and an external heat sink 108 may be coupled to the package substrate 122 having the die 114, 116 stacked thereon to form the chip package 110. When a cover 104 is utilized, TIM 166 is applied between the cover 104 and the upper surface 160 of the IC die 116.

At operation 708, the chip package 110 is mounted to the PCB 102. In one example, the chip package 110 is coupled through one or more solder connections 140 to conductors 154 disposed in or on the PCB 102. The solder connections 140 couple the conductors 154 of the PCB 102 to the conductors 148 of the package substrate 122, and thus to in-chip heat sink 112 of the IC die 114. In this manner, an efficient heat transfer path for heat generated by the first circuit 130 is formed through the lower surface 138 of the die body 124, passing through the package substrate 122 and into the conductors 154 of the PCB 102.

At operation 710, an optional heat sink 118 may be mounted to the lower surface 156 of the PCB 102. The heat sink 118 is coupled by the conductors 154 of the PCB 102 to the in-chip heat sink 112 of the IC die 114 via the heat transfer path described above. The heat sink 118 thus advantageously provides a heat sink for the heat generated by the first circuit 130.

Thus, an in-chip heat sink has been described that separates a high heat generating integrated circuit from another integrated circuit disposed within the same die, thus substantially reducing the amount of lateral heat transfer within the die which would otherwise thermally contaminate neighboring IC devices. The in-chip heat sink effectively draws heat away from the high heat generating integrated circuit, effectively enabling the use of high powered devices that would either become too hot or thermally contaminate other circuits of the die. Accordingly, the in-chip heat sink enables improved performance and greater design choices as compared to conventional packages. Furthermore, the in-chip heat sink enhances heat transfer out of the die, thus allowing better die performance at lower operating temperatures without having to rely on costly cooling countermeasures.

While the foregoing is directed to examples of the present implementation, other and further examples of the disclosure may be devised without departing from the basic scope thereof, and the scope thereof is determined by the claims that follow.

What is claimed is:

1. An integrated circuit die comprising:
   a die body having an upper surface and a lower surface, the lower surface having a plurality of bond pads for establishing electrical connection with circuitry within the die body;
   a first circuit disposed in the die body and electrically coupled to at least one of the bond pads, the first circuit configured to operate at a first temperature;
   a second circuit disposed in the die body and electrically coupled to at least one of the bond pads, the second circuit configured to operate at a second temperature that is less than the first temperature; and
   an in-chip heat sink having a ring-shape and an orientation extending between the upper surface and the lower surface, the in-chip heat sink separating the first circuit from the second circuit.

2. The integrated circuit die of claim 1, wherein the in-chip heat sink comprises:
   vias and lines formed in metals layers of the die body.

3. The integrated circuit die of claim 2, wherein the in-chip heat sink comprises at least one metal layer that is also in the first circuit.

4. The integrated circuit die of claim 1, wherein the in-chip heat sink circumscribes the first circuit.

5. The integrated circuit die of claim 1, wherein interconnect circuitry coupled to the first circuit passes through the in-chip heat sink.

6. The integrated circuit die of claim 1 further comprising:
   a first dummy metal island disposed in the die body proximate the first circuit and separated from the second circuit by the in-chip heat sink; and
   a second dummy metal island; and
   a via connecting the first dummy metal island to the second dummy metal island.

7. The integrated circuit die of claim 6, wherein the first dummy metal island is in direct contact with the in-chip heat sink.

8. The integrated circuit die of claim 1, wherein the upper surface of the die body further comprises:
   a plurality of metal filled recesses.

9. The integrated circuit die of claim 8, wherein at least one of the metal filled recesses is above or in direct contact with the in-chip heat sink.

10. The integrated circuit die of claim 1, wherein at least one of the bond pads is in direct contact with the in-chip heat sink.

11. An integrated circuit chip package comprising:
    a package substrate having a top side and a bottom side; and
    a first integrated circuit (IC) die coupled to the top side of the package substrate by first solder connections, the first IC die comprising:
       a die body having an upper surface and a lower surface, the lower surface having a plurality of bond pads for establishing electrical connection with circuitry within the die body;
       a first circuit disposed in the die body and electrically coupled to at least one of the bond pads, the first circuit configured to operate at a first temperature;
       a second circuit disposed in the die body and electrically coupled to at least one of the bond pads, the second circuit configured to operate at a second temperature that is less than the first temperature; and
       an in-chip heat sink having a ring-shape and an orientation extending between the upper surface and the lower surface, the in-chip heat sink separating the first circuit from the second circuit.

12. The integrated circuit chip package of claim 11 further comprising:
    a heat sink coupled to the bottom side of the package substrate, the heat sink conductively coupled by a via formed through the package substrate and contacting, through some of the first solder connections, the in-chip heat sink.

13. The integrated circuit chip package of claim 11 further comprising:
    a second IC die coupled to first IC by second solder connections, the second IC die having an in-chip heat sink coupled to the first IC by some of the second solder connections.

14. The integrated circuit chip package of claim 13, wherein the in-chip heat sink of the second IC die extends to an upper surface of the second IC die.

15. The integrated circuit chip package of claim 14, wherein the in-chip heat sink of the second IC die is electrically floating.

16. The integrated circuit chip package of claim 13 further comprising:
    a cover mounted over an upper surface of the second IC die, the cover;
    a thermal interface material disposed in contact with a contact pad terminating the in-chip heat sink at the upper surface of the second die and the cover; and
    a heat sink disposed on the cover.

17. An integrated circuit chip package comprising:
    a package substrate having a top side and a bottom side;
    a first integrated circuit die having a first in-chip heat sink; and
    a second integrated circuit die disposed on the top side of the package substrate, the second integrated circuit die having a first circuitry and a second circuitry separated by a second in-chip heat sink, the second in-chip heat sink coupled to the first in-chip heat sink through one or more solder connections.

18. The integrated circuit chip package of claim 17, wherein the second integrated circuit die further comprise:

a first circuit disposed in the second integrated circuit die, the first circuit configured to operate at a first temperature;

a second circuit disposed in the second integrated circuit die and separated from the first circuit by the second in-chip heat sink, the second circuit configured to operate at a second temperature that is less than the first temperature.

19. The integrated circuit chip package of claim 17, wherein the first in-chip heat sink is electrically floating and defines part of a highly conductive heat transfer path out through an upper surface of the second IC die.

20. The integrated circuit chip package of claim 17, wherein the second in-chip heat sink is coupled by solder connections to the package substrate forming a highly conductive heat transfer path out through a lower surface of the second IC die.

* * * * *